United States Patent [19]
Morita et al.

[11] Patent Number: 5,304,515
[45] Date of Patent: Apr. 19, 1994

[54] METHOD FOR FORMING A DIELECTRIC THIN FILM OR ITS PATTERN OF HIGH ACCURACY ON SUBSTRATE

[75] Inventors: Kiyoyuki Morita; Takeshi Ishihara, both of Osaka, Japan

[73] Assignee: Matsushita Electric Industrial Co., Ltd., Osaka, Japan

[21] Appl. No.: 925,675

[22] Filed: Aug. 7, 1992

Related U.S. Application Data

[60] Division of Ser. No. 689,730, Apr. 24, 1991, Pat. No. 5,185,296, which is a continuation of Ser. No. 384,593, Jul. 25, 1989, abandoned.

[30] Foreign Application Priority Data

Jul. 26, 1988 [JP] Japan .................................. 63-184627
Oct. 24, 1988 [JP] Japan .................................. 63-266187

[51] Int. Cl.⁵ ......................................... H01L 21/469
[52] U.S. Cl. .................................. 437/231; 437/235; 437/238
[58] Field of Search ............... 437/231, 225, 235, 238

[56] References Cited

U.S. PATENT DOCUMENTS

| | | | |
|---|---|---|---|
| 3,988,256 | 10/1976 | Vandermey et al. | 437/229 |
| 4,552,786 | 11/1985 | Berneburg et al. | 427/249 |
| 4,615,736 | 10/1986 | Armor et al. | 75/365 |
| 4,737,384 | 4/1988 | Murthy et al. | 427/370 |
| 4,798,740 | 1/1989 | Tomida et al. | 427/54.1 |
| 4,882,107 | 11/1989 | Cavender et al. | 264/54 |
| 4,944,837 | 7/1990 | Nishikawa et al. | 156/646 |
| 4,970,093 | 11/1990 | Sievers et al. | 427/294 |

FOREIGN PATENT DOCUMENTS 116504 11/1975 Fed. Rep. of Germany .
192333 9/1985 Japan .
077118 4/1988 Japan .

OTHER PUBLICATIONS

Wolf et al, *Silicon Processing for the VLSI Era*, Lattice Press, Sunset Beach (1986), pp. 407-409, 431.
*Kirk-Othmer Encyclopedia of Chemical Tech.*, Third Edition, vol.-supplement, New York, John Wiley & Sons, pp. 872-893, 1984.
S. Ghandhi, *VLSI Fabrication Principles*, John Wiley and Sons, New York, 1983, pp. 422-424.

*Primary Examiner*—Brian E. Hearn
*Assistant Examiner*—Laura M. Holtzman
*Attorney, Agent, or Firm*—Lowe, Price, LeBlanc & Becker

[57] ABSTRACT

A method and apparatus for forming a dielectric thin film or pattern thereof is provided in which a positive or negative resist of a desired pattern is formed on various substrates including a semiconductor substrate by contact of the resist with a liquefied gas or super critical fluid of $CO_2$, $NH_3$ or the like. Alternatively, a thin film of an organic or inorganic compound dissolved or dispersed in an organic solvent which has been formed on substrate becomes substantially free of any organic matter or functional groups by contact with the liquefied gas or super critical fluid. Semiconductor devices of high performance and high reliability are ensured.

14 Claims, 6 Drawing Sheets

METHOD FOR FORMING A DIELECTRIC THIN FILM OR ITS PATTERN OF HIGH ACCURACY ON SUBSTRATE

This application is a divisional application of application Ser. No. 07/689,730, filed Apr. 24, 1991, now U.S. Pat. No. 5,185,296, which is a continuation application of application Ser. No. 07/384,593, filed Jul. 25, 1989, now abandoned.

BACKGROUND OF THE INVENTION

1. Field of the Invention

This invention relates to a method and apparatus for forming a thin film or a thin film pattern of high accuracy on substrates including a semiconductor substrate.

2. Description of the Prior Art

As is well known in the art, large scale integrated circuits have become more highly integrated with a higher degree of miniaturization of pattern dimension and more advanced three dimentionality of devices. This involves the following various problems. First, it becomes difficult to form a pattern of high accuracy on substrate. This is because when the pattern dimension becomes finer, the pattern density and steps on a substrate give a more conspicuously adverse influence on the dimensional accuracy, with a lowering of the dimensional accuracy. Second, the step reduction or flattening of substrate is difficult to realize. This is because when a pattern is dimensionally miniaturized, steps on substrate becomes sharp. For further integration of large scale integrated circuit, the above difficulties or problems should be solved. These problems are described more particularly.

In prior art, patterning on substrate is usually performed by a procedure which comprises forming a radiation-sensitive organic thin film on a substrate, irradiating the film with a radiation in an imagewise pattern, and contacting the irradiated film with a developer. This is particularly shown in FIG. 1, which schematically shows the step of contacting the thin film with the developer. In the figure, a substrate 1 is contacted with a developer 10 whereupon regions 30 of an organic thin film irradiated with a radiation is dissolved in the developer 10 and removed. On the other hand, regions 31 of the organic thin film which have not been irradiated remain undissolved to obtain a desired pattern. In this procedure, the areal density of the thin film regions 30 irradiated with the radiation differs locally and thus, the concentration of the organic matter dissolved in the developer 10 is also varied locally. The local variation in the concentration of the organic matter in the developer 10 entails a difference in dissolution velocity of the organic thin film at the regions irradiated with the radiation with the dissolution velocity becoming locally irregular. Accordingly, the dimensional accuracy of the resultant pattern is lowered and thus a desired pattern cannot be obtained. Although the dissolution power for the irradiated organic thin film can be rendered uniform when the developer 10 contacting the substrate 1 is efficiently replaced by a fresh one, the developer is usually so viscous that the efficient replacement is not easy. In addition, when the substrate has a deep groove such as a trench, the developer 10 in the groove cannot be exchanged efficiently. The developing velocity for the irradiated organic thin film in the groove lowers with a long time being required for complete removal of the film in the groove. The long-time developing will lower the dimensional accuracy of the pattern. These problems can be solved when the developer in contact with the substrate can be efficiently replaced by a fresh one. More particularly, a solution developer having a low viscosity has to be used in order to solve the problems. In the prior art methods, however, it is essential to use liquids at normal temperatures, thus making it difficult to obtain a solution developer with a small viscosity.

Another problem of the step reduction of flattening of substrate has been conventionally coped with a technique wherein the surface of a dielectric film for layer insulation is flattened. The layer dielectric film used is ordinarily an inorganic thin film. The conventional inorganic thin film is so poor in step coverage with the attendant problem that slips are undesirably formed or even cracks may be formed when the film is made thick. To overcome this, there have been recently developed a chemical vapor deposition method using, for example, tetraethoxysilane, $Si(OC_2H_3)_4$, and a method using spin-on-glass (SOG) materials containing organic functional groups. This enables one to improve the step coverage and to form a thick film. However, the thin film formed by these methods contains a solvent and organic functional groups therein. When the solvent or organic functional groups are left in the thin film, a problem arises in a procedure subsequent to the formation of the thin film, with lowerings of yield and reliability. This is particularly described with reference to FIG. 2. In FIG. 2, a silicon oxide film is formed as a second layer dielectric film 201 of a semiconductor device of FIG. 2 by a known spin coating technique. If a solvent remains in the second layer dielectric film 201, a leakage current generates between a first aluminum wiring b (202a) and a first aluminum wiring a (202b). Also, a leakage current appears between the first aluminum wiring a and a second aluminum wiring 203. Such a leakage current will cause a final product to be defective with a lowering of yield. Moreover, if the concentration of a remaining solvent in the second dielectric film 201 is high, the first aluminum wirings 202a and 202b and the second aluminum wiring 203 which are in contact with the second layer dielectric film 201 suffer corrosion. The corrosion of the wirings will lower the reliability of the product. In FIG. 2, indicated at 204 is a p-type semiconductor substrate, at 205 is a field oxide film, at 206 is a gate oxide film, at 207 is a gate electrode, at 208 is an n-type diffusion layer, at 209 is a first dielectric film, at 210 is a contact hole and at 211 is a through-hole. The thermal treatment at high temperatures enables one to eliminate organic matters or organic functional groups from the thin film but will produce cracks in the film with a considerable lowering of yield. Accordingly, there has been a demand for a new method of removing the organic matters or organic functional groups from the thin film. Moreover, the known spin-on-glass (SOG) thin film formation method has a difficulty in obtaining a thick film. This is because, in the SOG method, the thermal treatment is used for both removal of solvent and formation of chemical bonds. The removal of solvent brings about shrinkage of the film. This shrinkage will pull $SiO_2$ bonds being formed and thus cause partial breakage of the bonds, resulting in cracks. For preventing the cracking and achieving formation of a thin film, it is necessary that the chemical bonds be formed subsequent to the removal of solvent.

SUMMARY OF THE INVENTION

It is accordingly an object of the invention to provide a method and apparatus for fabricating a semiconductor device of high reliability and high performance.

It is another object of the invention to provide a method and apparatus for forming a dielectric thin film or pattern on substrate in a high pattern dimensional accuracy.

It is a further object of the invention to provide a method and apparatus for forming a thin dielectric film or pattern on substrate without leaving any organic matter in the dielectric film.

It is a still further object of the invention to provide a method and apparatus for forming a thin dielectric film or pattern on a semiconductor substrate wherein a thin film containing organic matters and/or organic functional groups is first formed, contacted with a super critical fluid or liquefied gas and thermally treated to form a dielectric film whereby a flat thin film can be obtained reliably and in high dimensional accuracy.

According to one embodiment of the invention, there is provided a method for forming a dielectric film in a desired pattern with a high dimensional accuracy. This method comprises:

providing a substrate with or without a desired circuit pattern on one side thereof;

forming on the one side of the substrate a thin film of a radiation sensitive organic material whose molecular weight is changed by irradiation of a radiation;

irradiating the thin film with a radiation in a desired pattern; and contacting the substrate with a super critical fluid or liquefied gas to remove regions of the thin film which are made of a material having a lower molecular weight, thereby forming the desired pattern of the film.

In the above embodiment, the radiation sensitive organic thin film formed on the substrate is irradiated with a radiation in a desired pattern. By the irradiation, the thin film has two regions, one having been irradiated with the radiation and the other having not been irradiated. As a result, the two regions or portions have different molecular weights from each other. In this state, the irradiated film is contacted with a liquefied gas or super critical fluid. It will be noted here that the term "liquefied gas" used herein means a fluid which is in a condition of a pressure which is not less than a saturated vapor pressure in a pressure-temperature diagram of the gas and is gaseous under atmospheric pressure and normal temperature conditions. Likewise, the term "super critical fluid" means a fluid which is under conditions of not lower than a critical temperature and not less than a critical pressure in a pressure-temperature diagram of an intended compound. When pressure is gradually applied to a gaseous compound or solvent at a given temperature, the density of the compound is abruptly varied in a range where the pressure slightly exceeds the critical pressure. The resultant fluid exhibits a significant increase in solubility for various solutes. Accordingly, the liquefied gas or super critical fluid has a significantly higher solubility of organic matter than that in a gaseous condition. In addition, under appropriately controlled conditions, the dissolution velocity can be controlled depending on the molecular weight of organic matter. Accordingly, the contact of the thin film of the desired pattern with such a liquefied gas or super critical fluid enables one to rapidly dissolve regions of the thin film having a lower molecular weight. If the thin film is a positive resist, the irradiated regions can be removed from the substrate. The liquefied gas or critical super fluid has low viscosity, so that a once contacted gas or fluid can be efficiently replaced by a fresh one during the course of the contact. The dissolution velocity for the organic thin film on the substrate can be uniformly controlled. This leads to formation of the thin film pattern on the substrate in high accuracy and high pattern density. Since the liquefied gas or super critical fluid has high solubility for one region of the thin film and low viscosity, the film region in deep grooves or trenches on the substrate can be eliminated within a short time.

According to another embodiment of the invention, there is also provided a method for forming a dielectric thin film which comprises:

providing a substrate;

forming on one side of the substrate a thin film of a dielectric inorganic material obtained from an organic material and containing an organic matter and/or organic functional groups therein; and contacting the substrate with a super critical fluid or liquefied gas to remove the organic matter and organic functional groups from the film, thereby obtaining a dielectric thin film.

The dielectric thin film may be formed by another procedure using spin coating.

This procedure comprises:

providing a substrate;

forming on one side of the substrate a thin film of a compound capable of conversion into a dielectric inorganic material by thermal treatment and containing an organic matter and/or organic functional groups therein;

contacting the substrate with a super critical fluid or liquefied gas to remove the organic matter and organic functional groups from the film; and heating the substrate at temperatures sufficient to convert the organic compound into the dielectric inorganic material thereby forming a dielectric thin film on the substrate.

The formation of the thin film on the substrate.

The formation of the thin film according to these embodiments is advantageous in that the contact of the thin film with the liquefied gas or super critical fluid causes organic matters such as a solvent used and organic functional groups to be effectively removed from the thin film. The liquefied gas or super critical fluid generally has a low critical temperature, e.g. 31° C. for super critical carbon dioxide fluid. This permits removal of the organic matters and functional groups at temperatures significantly lower than by heat treatment. Accordingly, the resultant inorganic dielectric film is substantially free of undesirable organic matter and organic functional groups which would be otherwise contained in the film. The yield and reliability of the product increase drastically.

According to a further embodiment of the invention, there is provided an apparatus for the formation of a dielectric thin film on a substrate which comprises:

a unit system including a means for coating a solution, in an organic solvent, of a compound capable of conversion into a dielectric inorganic material, onto a substrate thereby forming a thin film of the compound on the substrate;

a substrate temperature control means for controlling a temperature of the substrate to a level sufficient to convert the compound into the dielectric inorganic material;

a means for rotating the substrate during the coating;

ports through which a liquefied gas or super critical fluid is charged from one port and discharged from another port; and a means for supplying the super critical fluid or liquefied gas through one port of the unit system for contact with the semiconductor substrate to remove organic matters and/or organic functional groups from the thin film.

Using the above apparatus, the spin coating, removal of organic matters, e.g. the solvent used, and thermal treatment are carried out in one unit system. This is effective in fabricating a semiconductive device of high reliability in high yield.

DETAILED DESCRIPTION AND EMBODIMENTS OF THE INVENTION

Reference is now made to the accompanying drawings and particularly, to FIGS. 3 to 6 which show a pattern formation method according to one embodiment of the invention.

Figure 1:
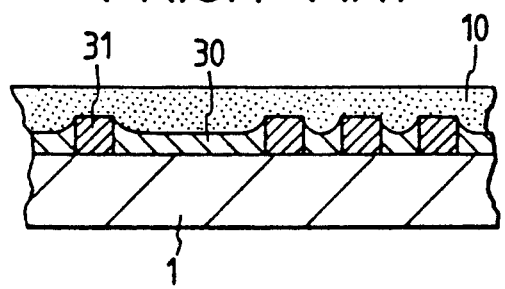
FIG. 1 is a schematic, partially enlarged sectional view of a substrate in contact with a developer according to a known procedure.
Figure 2:
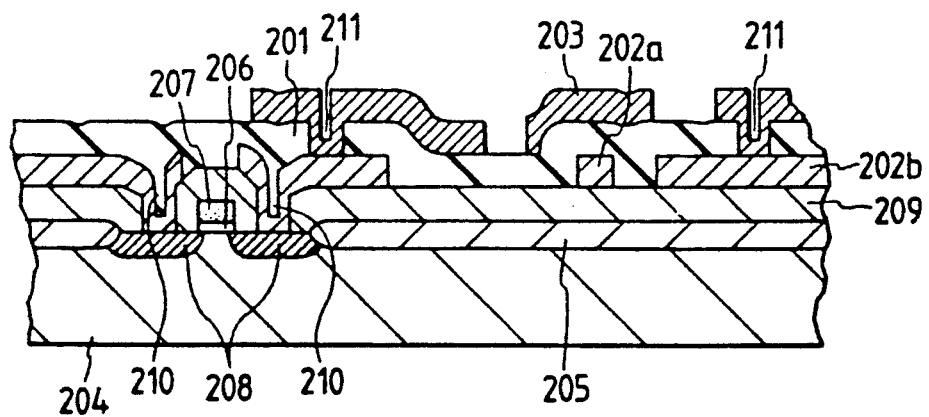
FIG. 2 is a schematic, partially enlarged sectional view of a semiconductor device fabricated by a known spin coating technique.
Figure 3:
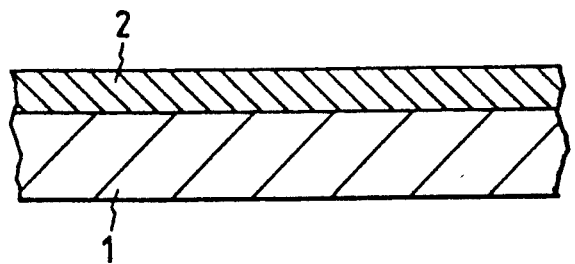
FIGS. 3 through 6 are schematic illustrative views of a pattern formation process according to one embodiment of the invention.

In FIG. 3, here is shown a semiconductor substrate 1 and a positive resist film 2 formed on the substrate 1. The film 2 may be formed by known techniques including spin coating and an adsorption method such as the Langmuir-Blodgett method.

Figure 4:
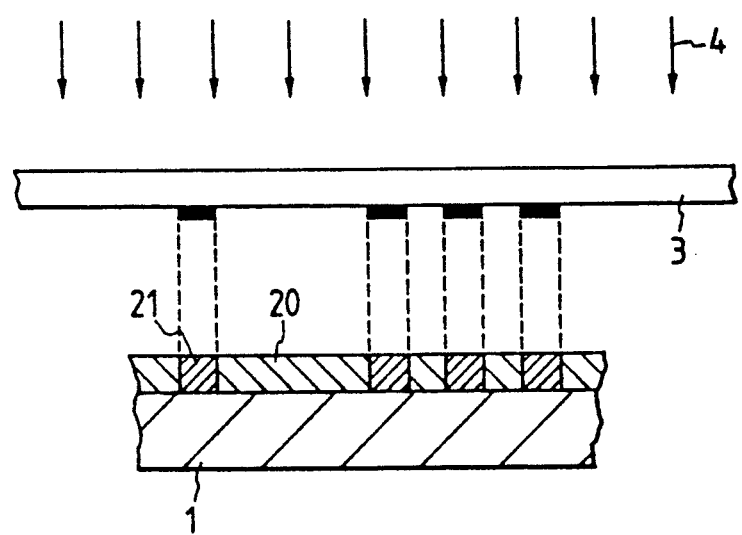

FIG. 4 shows patterning of the film 2 by photo-masking. In the figure, a photomask 3 is provided above the thin film 2 and a UV ray 4 with a suitable wavelength is passed through the photomask 3 for irradiation of the film 2 with the UV ray 4. After completion of the irradiation, the positive resist film 2 has two types of regions 20, 21. The region 20 has been irradiated with the UV ray 4 and the region 21 has not been irradiated with the UV ray 4. In the irradiated region 20, the resist is decomposed into materials having smaller molecular weights. However, in the region 21, no decomposition takes place and the resist material remains high in molecular weight.

Figure 5:
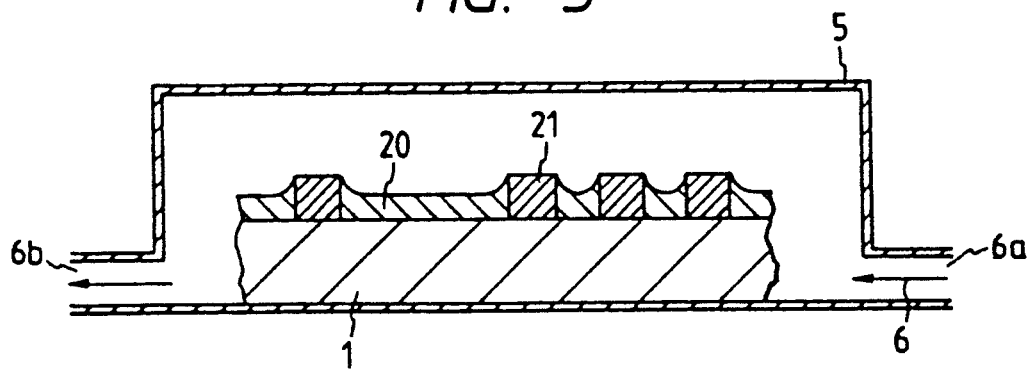
Figure 6:
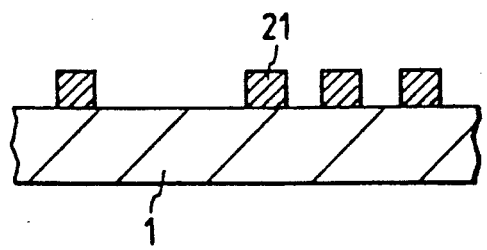

In FIG. 5, the substrate 1 is placed in a vessel 5 having ports 6a, 6b through which a liquefied gas or super critical fluid 6 is passed. For instance, carbon dioxide fluid 6 under super critical conditions of a pressure of 75 to 100 atms., and a temperature of from 50° to 100° C. is passed from the port 6a toward the port 6b along the arrows in the figure. The carbon dioxide fluid is able to dissolve the irradiated region 20 having a smaller molecular weight but is unable to dissolve the non-irradiated region 21 having a higher molecular weight. Accordingly, the irradiated positive resist region 20 alone can be removed from the substrate 1. The carbon dioxide fluid 6 has a low viscosity of, for example, 1 to $3 \times 10^{-4}$ g/cm second, so that the fluid 6 contacting the substrate 1 is invariably replaced by a fresh one during the passage of the fluid 6. This leads to a uniform control of the dissolution velocity of the irradiated positive resist 20 throughout the substrate. As a result, a pattern of the non-irradiated positive resist 21 is formed on the substrate 1 in high accuracy and in high density. This is particularly shown in FIG. 6. The carbon dioxide fluid has high solubility for the irradiated positive resist region 20 and a low viscosity.

If the substrate 1 has deep grooves on which the irradiated positive resist region 20 is formed, it can be removed within a short time. Although the passage time of the fluid may depend on the type of resist material, it is general that the time is from 100 to 200 seconds.

In the above embodiment, the carbon dioxide fluid under super critical conditions is used for illustration as a liquefied gas or super critical fluid. Any liquefied or super critical fluid may be used in the practice of the invention unless such a fluid is able to dissolve the non-irradiated positive resist region 20. Examples of the fluid include those of $N_2O$, $NH_3$ and the like.

The substrate 1 has been illustrated as semiconductive in nature, but an insulative substrate may be used. Moreover, the substrate may be a substrate in process wherein films of other materials such as a silicon oxide film, a silicon nitride film, an aluminum film are formed on the substrate in desired patterns.

The positive resist has been used as a material for irradiation sensitive organic thin film. However, any material which is sensitive to radiation and whose molecular weight varies significantly by irradiation with a radiation may be used, including negative resist materials. Typical examples of the positive resist materials useful for this purpose include novolac resins, azide compounds, phenolic resins, polymethyl methacrylate and the like. Examples of the negative resist materials include phenolic resins, azide resins and the like.

The formation of the positive resist film 2 may be effected by spin coating, the Langmuir-Blodgett method or the like.

The radiation set forth in the embodiment is a UV ray, but an electron beam may also be used. The patterning by photo-masking may be replaced by direct drawing.

In addition, depending on the type of radiation sensitive organic material, an organic solvent or compound may be added to the liquefied gas or super critical fluid as an extraction aid. For instance, if up to 10% by volume of ethanol is added to the carbon dioxide fluid, the dissolution velocity of the positive resist region 20 irradiated with a UV ray increases but the dissolution velocity of the non-irradiated positive resist 21 does not increase. This ensures a pattern which has higher accuracy and higher density.

Examples of such extraction aids include, aside from ethanol, methanol, ethylene, ethane and the like. Ethylene or ethane are readily converted into a fluid under super critical conditions indicated before.

Figure 7:
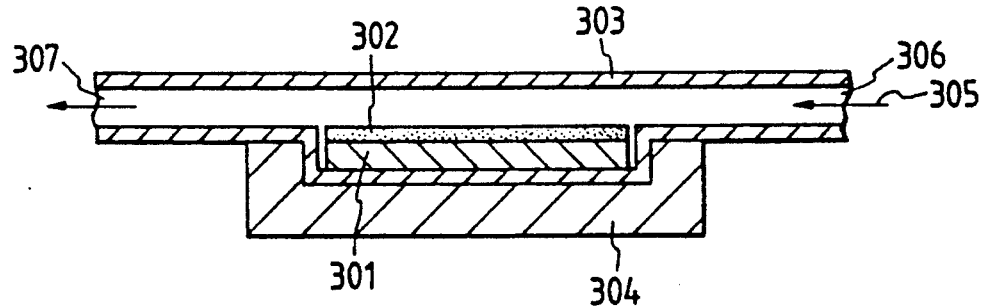
FIG. 7 is a schematic, partially enlarged sectional view illustrating a thin film formation process according to another embodiment of the invention.

A dielectric thin film formation process is then described with reference to FIG. 7.

In the figure, there is shown a semiconductor substrate 301 having a dielectric thin film 302, e.g. a silicon oxide film. The substrate 301 is placed in a vessel 303 having a substrate temperature control device 304 on which the substrate 301 is mounted. The vessel 303 has ports 306, 307 for liquefied gas or super critical fluid 305.

In operation, the silicon oxide film 302 is formed on the substrate 301 in a desired thickness by thermal decomposition of tetraethoxysilane ($Si(OC_2H_3)_4$). The film 302 has an ethoxy group, carboxyl groups formed by the decomposition of the ethoxy group and the like. These organic functional groups have to be removed for the reason described before. The substrate 301 is placed on the control device 304 of the vessel 303 and is controlled at a temperature of from 50° to 100° C. In this condition, the super critical carbon dioxide fluid 305 is passed to contact the semiconductor substrate 301. The pressure and temperature of the carbon dioxide fluid are, respectively, in the ranges of from 75 to 100 atms., and from 50° to 100° C.

The ethoxy group and carboxyl group in the thin film 302 are dissolved in the carbon dioxide fluid 305 and removed from the thin film 302. The thin film substantially free of any organic functional group ensures fabrication of a semiconductor device of very high reliability.

In the above embodiment, the thin film 302 is formed by thermal decomposition of tetraethoxysilane. Other organic silicone compounds such as $Si(OCH_3)_4$, $C_2H_5Si(OC_2H_5)$, polyimides, silanols and the like may be used to form the thin film by a CVD method or a spin coating method. Moreover, organometallic compounds such as $Al(CH_3)_3$, $Al(C_2H_5)_3$, $Al(i-C_4H_9)_3$ and the like and metal halide compounds such as $AlCl_3$, $WF_5$ and the like may be used. In this case, a CVD method or thermal decomposition are preferred.

As in the first embodiment, the super critical fluid may be not only a carbon dioxide fluid, but also any other fluids such as $N_2O$, $NH_3$ and the like. These fluids are used depending upon the type of functional group to be removed. If organic functional groups are hard to be removed, an extraction aid such as $CH_3OH$, $C_2H_5OH$ or the like may be added to the fluid in amounts defined before.

The formation of the dielectric thin film by the use of spin coating is described. The spin coating is effective when the film is formed from a solution, in an organic solvent, of an organic compound capable of conversion into an inorganic material and also when a relatively thick film is formed. For this purpose, spin coating is appropriate.

Figure 8:
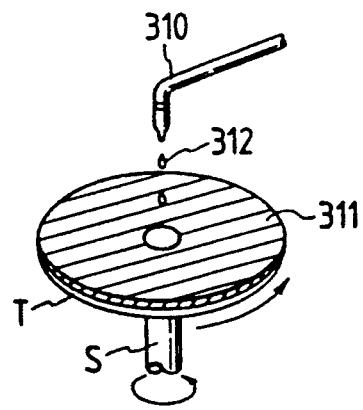
FIG. 8 is a schematic illustrative view of spin coating used in embodiments of the invention.

FIG. 8 shows spin coating of a solution of a silanol compound. In the figure, a spin coater 310 is used to spin coat a solution 312 of a silanol compound in an organic solvent such as ethanol onto a semiconductor substrate 311 to form a thin film on the substrate 311. The semiconductor substrate 311 is placed on a rotary table T having a shaft S which is rotated by a motor (not shown). For the spin coating, the substrate 311 is generally rotated at 3000 to 5000 r.p.m. The solution has generally a concentration of the silanol compound of from 1 to 15 wt. % although this concentration is not critical.

Figure 9:
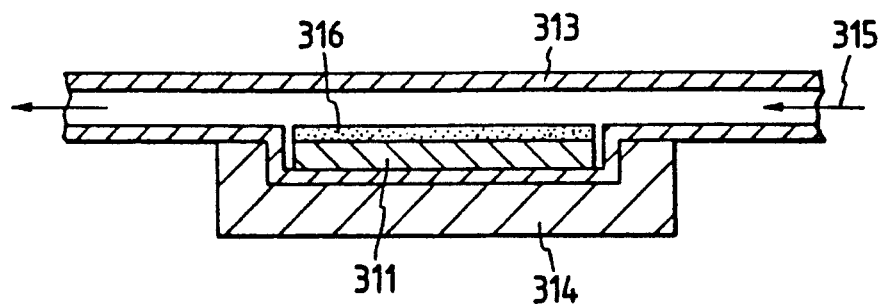
FIG. 9 is a schematic, partially enlarged sectional view illustrating a thin film formation process according to a further embodiment of the invention.

The coated substrate 311 is placed in a vessel 313 of FIG. 9. The vessel 313 is similar to that shown in FIG. 7. The substrate 311 is placed on a substrate temperature control unit 314 and controlled at a temperature of from 50° to 100° C. Subsequently, the substrate 311 is contacted with a super critical carbon dioxide fluid 315 as shown. The carbon dioxide fluid is under super critical conditions of from 75 to 100 atms., and from 50° to 100° C. By the contact, the organic solvent in the thin film is dissolved in the carbon dioxide fluid and completely removed from the film. The contact time is generally in the range of from 30 to 60 minutes.

Figure 10:
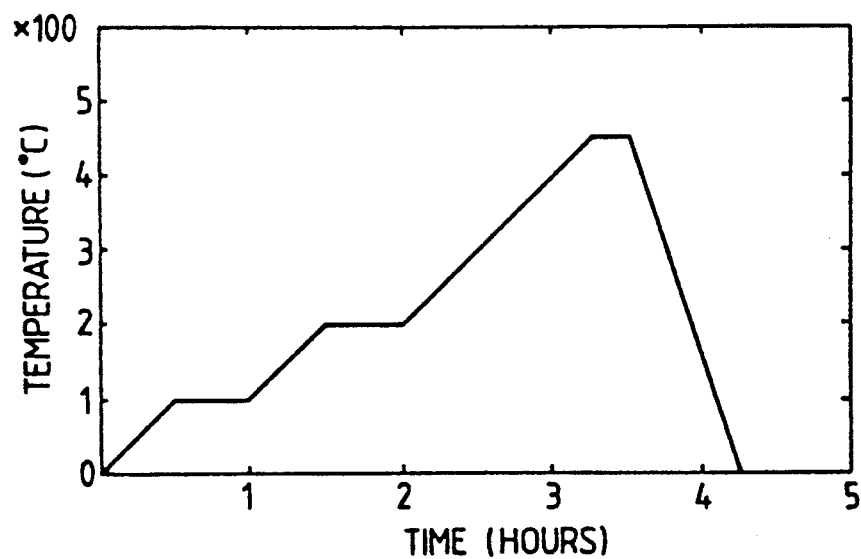
FIG. 10 is a graphical representation of the temperature in the variation in time during the course of thermal treatment for a silanol compound.

Thereafter, the semiconductor substrate 311 is heated in a stepwise manner up to 450° C. by means of the temperature control unit 314 This heat treatment may differ depending on the type of compound and the thickness of the film. For instance, a silanol compound dissolved in an alcohol is deposited in a thickness of 500 nm. The heat treatment is appropriately carried out according to a time-temperature profile as shown in FIG. 10. If the thermal treatment time is too short, a leakage current is apt to pass through the thin film. On contrary, when the thermal treatment time is too long, a hillock phenomenon is liable to take place. As a result of the heat treatment, the silanol compound is chemically bonded thereby forming a silicon oxide film. Thus, it is possible to fabricate a highly reliable semiconductor device.

According to the above procedure, cracking rarely takes place in the film, so that a thick silicon oxide film can be readily made. This is because $SiO_2$ bonds are formed after completion of the shrinkage of the film by removal of the solvent, so that the $SiO_2$ bonds are not broken owing to the shrinkage. When a thick silicon oxide film can be formed by spin coating, a semiconductor device having a multi-layered metal wiring can be simply fabricated in high yield.

This is more particularly described with reference to FIGS. 11 to 13.

Figure 11:
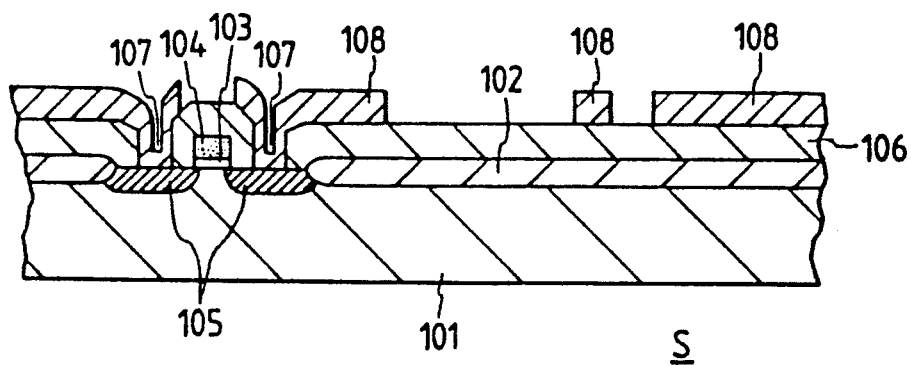
FIGS. 11 to 13 are, respectively, schematic, partially enlarged sectional views illustrating a fabrication process of a semiconductor device according to the invention.
Figure 12:
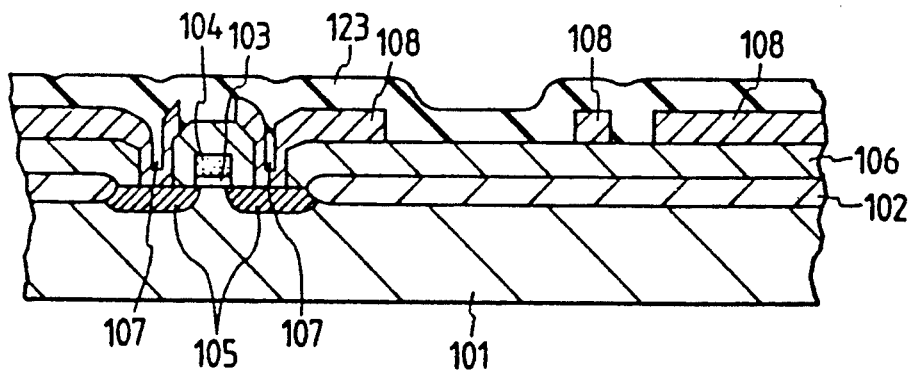

In FIG. 11, there is schematically shown a semiconductor device S which is in process. Fabrication of the device S is as follows. For instance, a p-type semiconductor substrate 101 is provided, on which is formed a field oxide film 102 according to a selective oxidation process in a thickness of about 500 nm. Subsequently, a 16 nm thick gate oxide film 103 and a 330 nm thick gate electrode 104 are formed as shown. At opposite sides of the gate oxide film 103 are formed n-type diffusion layers 105 by ion implantation of As at a dose of $5 \times 10^{15}$ cm$^{-2}$. A 70 nm thick $SiO_2$ dielectric film 106 is deposited over the substrate and contact holes 107 are made, followed by formation of 800 nm thick first aluminum wirings 108 as shown. In this condition, a solution of a silanol compound is spin coated over the p-type semiconductor substrate 101 in the same manner as shown with reference to FIG. 8. The thus coated p-type semiconductor substrate 101 is placed in a vessel and contacted with a super critical carbon dioxide fluid as shown with reference to FIG 9 under the same conditions as set out before. The organic solvent is dissolved in the carbon dioxide fluid and removed from the coated film, followed by gradually heating up to 450° C. in a time schedule as shown in FIG 10, thereby forming a second dielectric film 123 as shown in FIG. 12. The heat treatment causes the silanol compound to be chemically combined or bonded thereby forming a 700 nm thick silicon oxide film as the second dielectric film 123.

Figure 13:
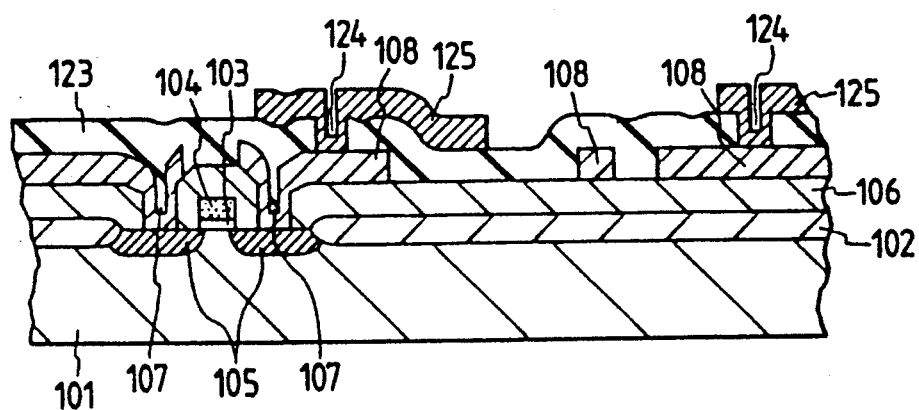

In FIG. 13, through-holes 124 are formed as shown and 1000 nm thick second aluminum wirings 125 are also formed as shown.

According to the process of the invention, when the second dielectric film 123 has a thickness of 700 nm, no crack is formed in the film 123. Since the second dielectric film 123 is formed by the use of spin coating, the film 123 has a smooth upper surface. Accordingly, the second aluminum wirings 125 involve no disconnection. Moreover, since no solvent is contained in the dielectric film 123, no leakage current appears between the first aluminum wirings 108 and between the first aluminum wirings 108 and the second aluminum wirings 125. Additionally, no corrosion is produced on the respective aluminum wirings.

Thus, the dielectric film may be formed on a stepped substrate reliably and in high accuracy according to the invention. Although the silanol compound is used in the above procedure, other inorganic or organic silicon compounds may be likewise used provided that they exhibit insulating properties after thermal treatment.

Figure 14:
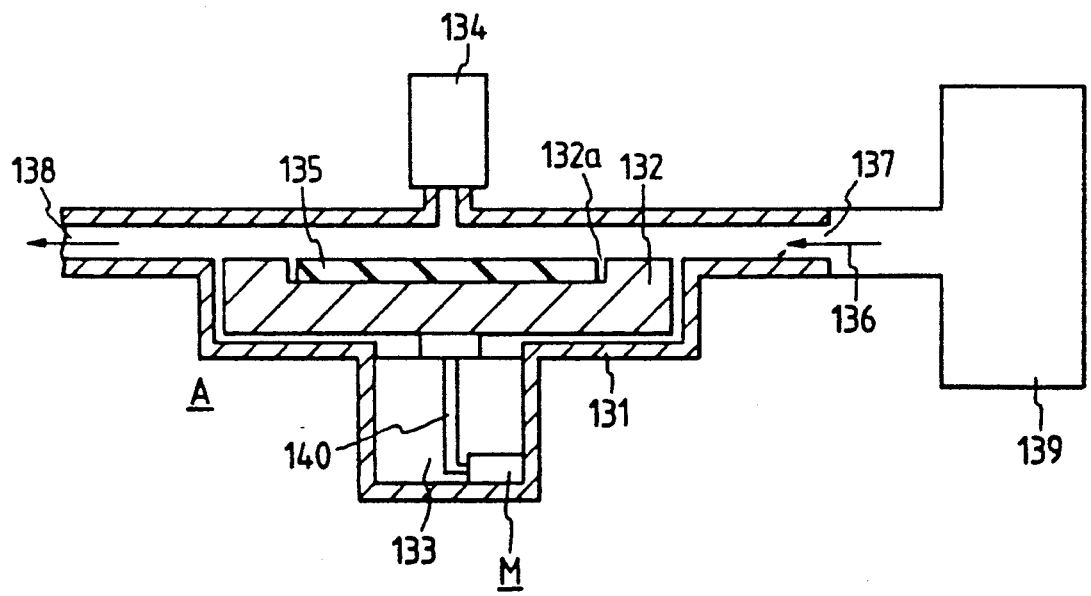
FIG. 14 is a schematic, partially enlarged sectional view of a thin film formation apparatus according to the invention.

FIG. 14 shows a thin film formation apparatus A according to the invention, wherein all the steps described before and including spin coating, removal of solvent or other organic matters and conversion of a compound or material into a dielectric material are performed.

The apparatus A includes a vessel 131 having a substrate temperature control unit 132 of a disk form and a rotation control unit 133 associated with the temperature control unit 132 to control the rotation of the unit 132. The temperature control unit 132 has a recess 132a which snugly receives a substrate 135 therein. Over the unit 132 is provided a spin coater 134 for solution. The vessel 131 has ports 137, 138 through which a super critical fluid or liquefied gas 136 is passed for contact with the substrate 135. The vessel 131 is connected with a fluid source 139 from which the fluid 135 under super critical conditions of 75 to 100 atms., and 50° to 100° C. is supplied to the vessel 131.

The rotation control unit 133 may be arranged to have a shaft 140 connected to the temperature control unit 132 at one end and connected to a motor M at the other end. The motor is electrically controlled for the spin coating.

In operation, the substrate 135 is mounted on the unit 132 and controlled at a temperature of from 50° to 100° C. The unit 132 having the substrate 135 is rotated by means of the rotation control unit 133 and a suitable solution of a compound capable of being thermally converted into a dielectric inorganic substance is spin coated on the substrate 135 by means of the spin coater 134 thereby forming a thin film. Subsequently, the super critical fluid 136 is passed from the source 139 into the vessel 131 for contact with the substrate 135. The organic matter mainly composed of the solvent used is dissolved in the fluid 136 and completely removed. After the removal, the temperature of the substrate 135 is raised by the use of the unit 132 to convert the compound into the dielectric inorganic substance. Thus, a dielectric thin film is obtained.

This apparatus is effective in forming a dielectric thin film of high quality on various substrates readily and in high yield.

What is claimed is:

1. A method for forming a dielectric thin film which comprises:

providing a substrate;

forming on one side of the substrate a thin film of a dielectric inorganic material obtained from an organic material, said thin film of a dielectric inorganic material containing an organic component selected from the group consisting of organic matter, organic functional groups, and mixtures thereof; and contacting the substrate with a super critical fluid or liquefied gas to remove the organic component from the film, thereby obtaining a dielectric thin film.

2. A method according to claim 1, wherein said substrate is a semiconductor substrate.

3. A method according to claim 1, wherein said organic material is an organosilicon compound and said thin film is made of silicon oxide and is formed by thermal decomposition of the organosilicon compound.

4. A method according to claim 1, wherein said organic material is an organosilicon compound and said thin film is made of silicon oxide and is formed by chemical vapor deposition of the organosilicon compound.

5. A method according to claim 1, wherein said thin film is formed by chemical vapor deposition of an organic metal compound.

6. A method according to claim 1, wherein the super critical fluid is a carbon dioxide fluid under conditions of from 75 to 100 atms., and from 50° to 100° C.

7. A method according to claim 1, wherein the liquefied gas or super critical fluid contains up to 10% by volume of an extraction aid.

8. A method for forming a dielectric thin film which comprises:

providing a substrate;

forming on one side of the substrate a thin film of a compound capable of conversion into a dielectric inorganic material by thermal treatment, said thin film containing an organic component selected from the group consisting of organic matter, organic functional groups and mixtures thereof;

contacting the substrate with a super critical fluid or liquefied gas to remove the organic component from the film; and heating the substrate at temperatures sufficient to convert the compound into the dielectric inorganic material, thereby forming a dielectric thin film on the substrate.

9. A method according to claim 8, wherein said substrate is a semiconductor substrate.

10. A method according to claim 8, wherein said thin film is formed by spin coating of an organosilicon compound.

11. A method according to claim 8, wherein the super critical fluid is a carbon dioxide fluid kept under conditions of from 75 to 100 atms., and from 50° to 100° C.

12. A method according to claim 8, wherein the liquefied gas or super critical fluid contains up to 10% by volume of an extraction aid.

13. A method according to claim 8, wherein the heating is carried out during or after completion of the contacting step.

14. A method according to claim 8, wherein the substrate is heated up to 450° C. in a stepwise heating manner.

* * * * *